United States Patent
Hyun et al.

[11] Patent Number: 5,644,247
[45] Date of Patent: Jul. 1, 1997

[54] TEST SOCKET AND METHOD FOR PRODUCING KNOWN GOOD DIES USING THE TEST SOCKET

[75] Inventors: In Ho Hyun, Kiheung; Sang Hyeong Lee, Suwon; Il Ung Kim, Seoul, all of Rep. of Korea

[73] Assignee: Samsung Electronics Co., Ltd., Suwon, Rep. of Korea

[21] Appl. No.: 644,396

[22] Filed: May 9, 1996

Related U.S. Application Data

[63] Continuation of Ser. No. 279,636, Jul. 25, 1994, abandoned.

[30] Foreign Application Priority Data

Jul. 23, 1993 [KR] Rep. of Korea .................. 93-13979

[51] Int. Cl.$^6$ ................................................ G01R 31/02
[52] U.S. Cl. .................................................... 324/755
[58] Field of Search ................................ 324/158.1, 754, 324/755, 73.1; 437/8

[56] References Cited

U.S. PATENT DOCUMENTS 5,247,248  9/1993  Fukunaga .................. 324/760
5,367,253  11/1994  Wood ....................... 324/158.1
5,378,981  1/1995  Higgins ..................... 324/158.1

*Primary Examiner*—Kenneth A. Wieder
*Assistant Examiner*—Russell M. Kobert
*Attorney, Agent, or Firm*—Cushman Darby & Cushman IP Group of Pillsbury Madison & Sutro LLP

[57] ABSTRACT

A test socket and a method for identifying a known good die using the test socket. The test socket includes a substrate having penetrating apertures, and land patterns formed around the penetrating apertures. The substrate has contact terminals at one side which are connected to the outside, and a protective casing is installed on the upper part of the substrate. After the semiconductor chips are mounted in the test socket by a piece of adhesive tape, to cover the penetrating apertures of the substrate, the bonding pads of the semiconductor chips and the land patterns of the substrate are connected to each other by wires. The test socket is then installed on a burn-in test board to carry out a burn-in test. The wires of the bare chips, which have been subjected to the burn-in test are cut by a cutting device, and a lower portion of each semiconductor chip corresponding to a known good die, is hit by an ejection pin through the penetrating apertures of the substrate to separate and obtain the known good dies. Accordingly, a plurality of known good dies may be obtained by carrying out one burn-in test.

16 Claims, 2 Drawing Sheets

TEST SOCKET AND METHOD FOR PRODUCING KNOWN GOOD DIES USING THE TEST SOCKET

This is a continuation of application Ser. No. 08/279,636, filed Jul. 25, 1994, which was abandoned upon the filing hereof.

BACKGROUND OF THE INVENTION

(1) Field of the Invention

The present invention relates to a test socket and method for producing known good dies using a test socket. More particularly, it relates to a test socket and a method for producing known good dies in which known good dies can be mass-produced and carried through tests such as the electrical and burn-in tests, performed on a plurality of semiconductor chips which are separated from a wafer by conventional semiconductor manufacturing steps.

(2) Description of Related Art

Generally, various tests are carried out on a semiconductor chip in order to ensure device reliability. The tests are typically divided between electrical tests for identifying normal or abnormal operation and circuit disconnections, and a burn-in test for examining the durability of a semiconductor chip and the occurrence of flaws, performed by connecting some input/output terminals of the semiconductor chips to a test signal generating circuit and applying stresses, such as higher than normal temperature, voltage, current, etc.

For example, in case of a dynamic random access memory, a burn-in test is performed to identify any flaws in memory circuits and memory cells.

The semiconductor chip has disadvantages such as deterioration of insulating film in a gate oxide layer at the time of being used under normal conditions during burn-in. Accordingly, chips having defects are detected by the burn-in test for removing such defects, which are to be shipped, in order to ensure the reliability of the goods.

However, the electrical and burn-in test is rarely performed on normal bare chips separated from a wafer because of the difficulty in electrical connection with the test signal generating circuit. Therefore, the electrical and burn-in tests are carried out on semiconductor chips which are packaged by molding compounds, (e.g., epoxy molding compound (EMC)). Such a semiconductor package includes an untested semiconductor chip mounted on a die pad, inner leads connected to bonding pads of the chip by wires, and a package body shielding the chip and wires.

Outer leads, opposite to respective inner leads protrude from the body of the semiconductor package, and are inserted in a test socket having socket holes for receiving the outer leads. After that, the test socket is mounted on a burn-in test substrate to carry out the burn-in test.

However, such a semiconductor package has limits in high density mounting. A flip chip technique has been developed in which a plurality of bare chips are mounted directly on an insulating ceramic substrate, instead of using individual packages. In addition, various techniques for making a semiconductor chip with high speed, high capacitance and very large scale integration in a small size have been proposed. A representative technique is the multi chip module (MCM).

The MCM includes a plurality of semiconductor chips mutually connected to each other on a multi-layer ceramic substrate on which high density wiring is provided, whereby a very large scale integration is obtained. Computer companies such as IBM, DEC, Hitachi, etc. have applied the MCM to supercomputer.

The MCM, however, has technical and economical limitations, even though the MCM can mount more semiconductor chips than a conventional singular semiconductor chip packaging technique, with improved integration. Its production yield is remarkably decreased, thereby increasing the manufacturing cost. In particular, the major problem of the MCM is the difficulty of identifying known good dies, to ensure reliability as high as that of conventional packaging techniques.

Even though the demand for known good dies used in the MCM is increased, it is difficult to mass-produce known good dies at a low cost. A single bare chip separated from a wafer does not have outer leads and cannot use the above-described test socket for semiconductor package testing. Thus, electrical and burn-in tests cannot be performed before the single bare chip is mounted on a printed circuit board.

In order to solve these problems, various types of techniques have been developed, such as a hot chuck probe technique, a tape automated bonding (TAB) technique, a technique for using a flip chip test socket adapter, a wafer-level test technique, and a method for making a known good die produced by the wafer-level test technique and test housing. However, these techniques have the same problem of unduly high manufacturing cost for mass-production.

Referring first to the hot chuck probe technique, a hot chuck probe has terminals which contact the bonding pads of the chip to carry out the test. This technique does not need additional steps to process the wafer, and can supply users with bare chips. However, it requires a great deal of time to carry out the test. For different types of semiconductor chips, additional hot chuck probes are required, thereby increasing the manufacturing cost.

The TAB technique tests semiconductor chips by connecting respective ends of thin metal film leads to test terminals, wherein a semiconductor chip is connected via a chip bump to the other ends of thin metal film leads of a tape carrier in an insulating film.

A technique using the flip chip test socket adaptor is disclosed in U.S. Pat. No. 5,006,792. A bare chip having solder bumps associated with each bonding pad of the chip is inserted in an exclusive adaptor to carry out the test. The test socket adaptor is provided with a board on which cantilever beams are correspondingly connected to the solder bumps of the semiconductor chip. The board is received in a case, and input/output terminals extending outside the case are inserted in a burn-in test substrate to perform the burn-in test.

The above-mentioned techniques are widely known and can carry out testing of a bare chip prior to packaging.

However, the process for making a necessary bump on bonding pads of a single, base semiconductor chip requires expensive equipment for accommodating the minute pitch, which exists between the bonding pads as a result of high integration. Besides, the semiconductor chips must be handled individually during the tests, thereby making chip handling complicated, and decreasing the yield of the tested chips, resulting in an increase of the manufacturing cost, compared with the cost of manufacturing general semiconductor packages.

The tape carrier according to the TAB method, cannot be recycled, and the technique of using the test socket adaptor is complicated due to unique structure of the test socket, thereby making the manufacture difficult.

The wafer-level test is an ideal technique for carrying out testing collectively after all the chips formed on the wafer have been connected with contact terminals. However, it is impossible to make contact terminals corresponding to the bonding pads for all the chips, and noise may also occur due to using the same substrate.

The following description, with reference to FIG. 1, of a method for making a known good die with by a test housing is disclosed in U.S. Pat. No. 5,173,451 in order to solve the above described problems.

First, exterior connector leads 14 are installed on the exterior of a ceramic substrate 12 of rectangular shape and having a die-receiving cavity 11 at its center for mounting a semiconductor chip 16 therein by means of a piece of bonding tape 13. Contact pads 17 are formed on an end portion inside the ceramic substrate 12 corresponding to the bonding pads 15 of the semiconductor chip 16. The contact pads 17 are connected to the exterior connector leads 14 by internal wiring (not illustrated).

The bonding pads 15 and contact pads 17 are connected by a wire 18, which is soft-bonded to the pads 15, 17 to facilitate removal of the wire 18.

On an upper portion of the ceramic substrate 12, a flange 19 of rectangular shape is installed, to seal the inside thereof. The exterior connector leads 14 are then inserted in a test board (not illustrated) to carry out the burn-in test.

In producing the known good dies provided in the test housing, a single semiconductor chip 16 is mounted by means of a piece of adhesive tape 13, in the die-receiving cavity 11 of the ceramic substrate 12. The substrate 12 has exterior connector leads 14, as in the conventional semiconductor package. The bonding pads 15 of the semiconductor chip 16 are connected to the contact pads 17 inside the substrate 12 by the wire 18. A plurality of bare good dies are likewise mounted on the test board in order to permit one to carry out the burn-in test collectively on all of them.

After testing, the tested bare dies in the test housing 10 are separated from the test board, and after the flange 19 and the wires 18 are sequentially removed, the semiconductor chips 16 are finally separated to obtain flawless known good dies.

Accordingly, several known good dies are obtained through one test procedure, and the production yield may be enhanced.

However, the structure of the ceramic substrate 12 is complicated and limited to only one type of substrate, resulting in an increase in the manufacturing cost. Besides, the bonding pads 15 wire-bonded once are damaged, resulting in a decrease in their reliability.

SUMMARY OF THE INVENTION

The present invention is made in an effort to solve the above described problems.

It is a first object of the present invention to provide a test socket that can be used to mass-produce known good dies at a low cost, by installing a plurality of semiconductor chips on an easy-to-make test socket and carrying out wire-bonding and installation of a plurality of such a test sockets on a test substrate, for a burn-in test.

It is a second object of the present invention to easily mass-produce known good dies, while simultaneously preventing the semiconductor chips from being damaged during the burn-in test.

In order to achieve the above objects, the test socket according to the present invention comprises a substrate including exterior contact leads contacting an exterior burn-in test board at one end of the test socket, a plurality of penetrating apertures having a predetermined distance from the exterior contact leads, and at least one land pattern formed to be connected to the contact leads around said penetrating apertures by metal wires, a plurality of semiconductor chips mounted by adhesive means on an upper part of the penetrating apertures formed on the center of the substrate and including a plurality of bonding pads, the metal wires for electrically connecting bonding pads of semiconductor chips to land patterns, and a casing detachably engaged to the substrate, and which exposes the exterior contact leads of the substrate and covers the wires and semiconductor chips.

Also, in order to achieve the above objects, the method of the invention for making a known good die comprises the steps of mounting penetrating apertures formed on a central portion of a substrate with a predetermined distance between then, land patterns formed around the penetrating apertures, semiconductor chips on a substrate including contact leads formed to be connected with exterior terminals at one side of the substrate after a piece of double-sided adhesive tape is inserted on the upper parts of the penetrating apertures, connecting the bonding pads of the semiconductor chips to the land patterns of the substrate by wires, performing a burn-in test by installing the substrate on a test board, cutting the wires using a cutting means, and separating flawless semiconductor chips after being subjected to the burn-in test, by pushing up the rear portion of the respective semiconductor chips through the penetrating apertures of said substrate.

DETAILED DESCRIPTION OF THE INVENTION

A preferred embodiment of the present invention is described in detail with reference to the accompanying drawings.

Figure 1:
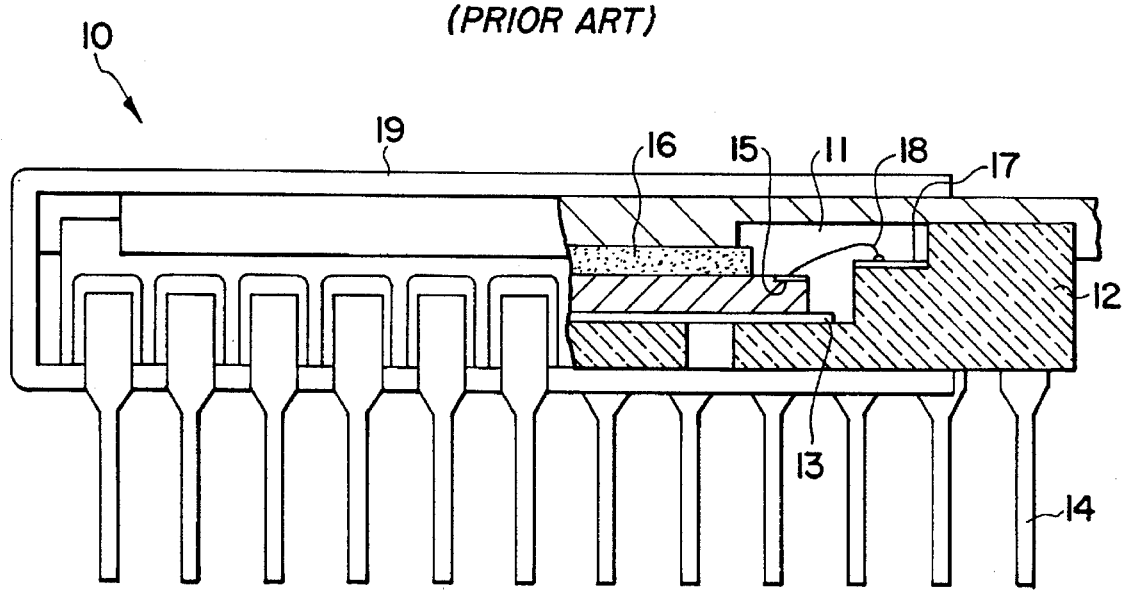
FIG. 1 is a cross-sectional view of a conventional test socket for testing a known good die.
Figure 2:
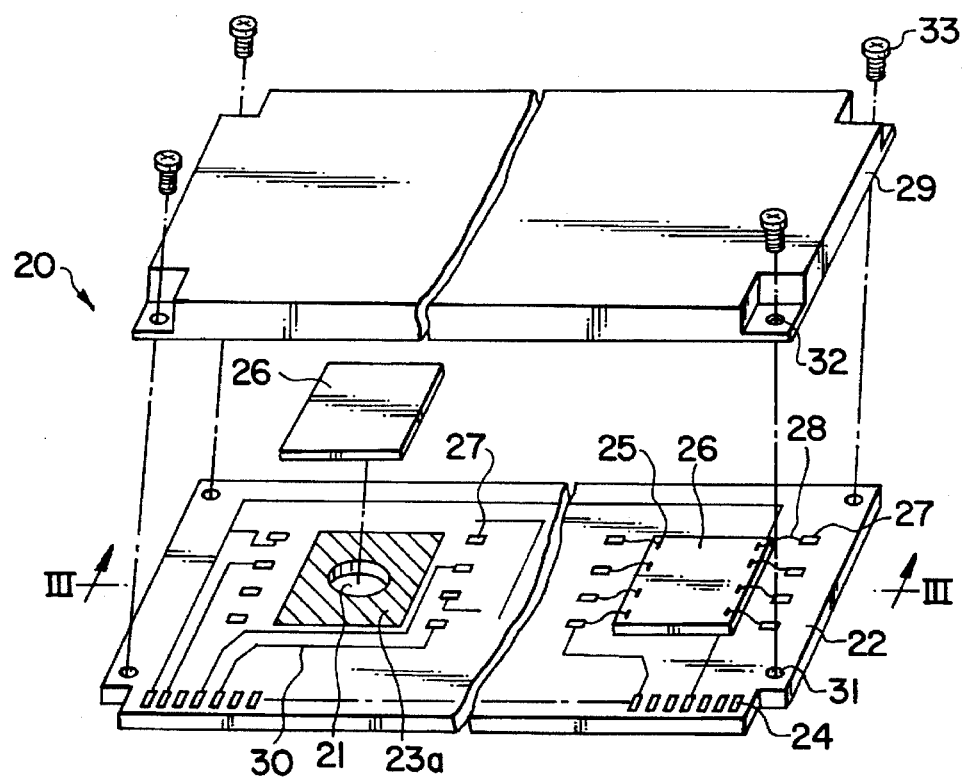
FIG. 2 is an exploded perspective view showing a preferred embodiment of a test socket for testing a known good die in accordance with the present invention.
Figure 3:
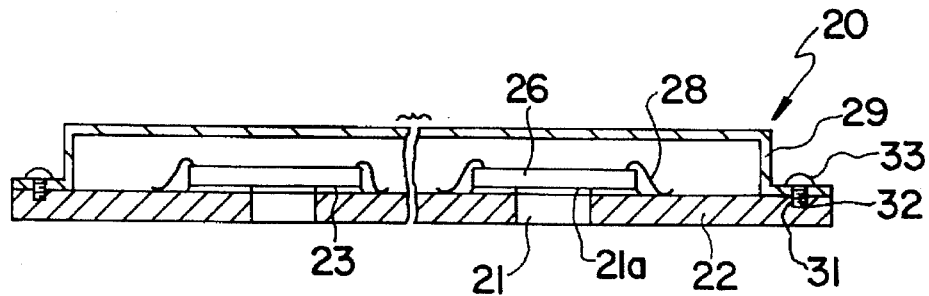
FIG. 3 is a cross-sectional view as taken along line III—III in FIG. 2.

FIGS. 2 and 3 show a test socket 20 for a testing known good die in accordance with the present invention.

A test socket 20 includes connector leads, (e.g., insertion terminals 24) for electrical connection with the outside, formed on one side of a generally rectangular-shaped substrate 22 made of ceramic, plastic or the like, penetrating apertures 21 formed with a predetermined distance between them, and land patterns 27 formed around the penetrating apertures 21.

The penetrating apertures 21 each have a smaller diameter than the corresponding lateral dimension of a semiconductor chip 26 to be mounted thereon, and the land patterns 27 are formed in correspondence to the bonding pads 25 of the semiconductor chip 26.

The land patterns 27 are connected to the insertion terminals 24 by metal wires 30 formed on the substrate 22. The substrate 22 includes coupling means, (e.g., screw threaded sockets 31 located at the four corners thereof) for engaging the casing and the substrate.

The semiconductor chip 26 is mounted by double-faced insulating adhesive tape 23 so as to cover the penetrating apertures 21. The adhesive tape 23 is formed by applying an adhesive to both sides of a polyimide film which is heat-resistant at temperatures of 120° to 150° C. during the burn-in procedure.

The adhesive tape 23 has a hole 21a at its center, corresponding to the penetrating aperture 21, for facilitating separation of the semiconductor chip 26 from the adhesive tape 23 after processing. The bottom of the semiconductor chip 26 is exposed through the penetrating aperture 21 and the hole 21a.

The land patterns 27, formed correspondingly to the bonding pads 25 of the semiconductor chip 26, are connected to the bonding pads 25 by wires 28.

A casing 29 is formed from a material that can prevent static electricity, (e.g. a metal of low resistance, plastic for preventing static-electricity, or plastic coated with static electricity-preventing material), and is installed on the upper portion of the substrate 22. The casing 29 has holes 32 for receiving screws 33. Screws 33 are, in turn, engaged in screw threaded sockets 31 in the substrate. The casing 29 prevents deformation of the wire 28, by protecting the wires 28 and the semiconductor chips 26 against outside contact, and is formed to leave the insertion terminals 24 exposed.

A plurality of such test sockets 20 are inserted and mounted via insertion terminals 24 on a burn-in test board (not illustrated). The test board carries out the burn-in test by applying stress, such as higher than normal temperature, voltage and current to the semiconductor chip 26. After the burn-in test, the screws 33 are released and the casing 29 is removed to separate the bonded semiconductor chips.

Accordingly, a known good die is obtained by separating a tested semiconductor chip 26 which has been subjected to the burn-in test.

In the test socket 20, a plurality of semiconductor chips 26, (.e.g., 8 to 10 chips) are mounted on one test socket 20. Twenty or so test sockets 20 are mounted on the burn-in test board, so 160 to 200 semiconductor chips may be checked through one burn-in test to obtain a plurality of known good dies.

The substrate 22 may be used over a long term, as long as there is no structural abnormality in the contact pads 27 on, or from which, the wires 28 are frequently mounted or removed. If the substrate 22 is a printed circuit board, the production cost of the substrate 22 is very low.

Figure 4A:
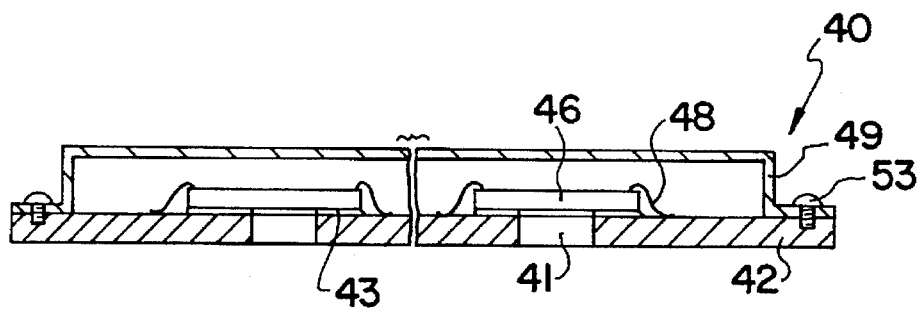
FIGS. 4A to 4B show the steps in the manufacture of a known good die in accordance with the present invention.
Figure 4B:
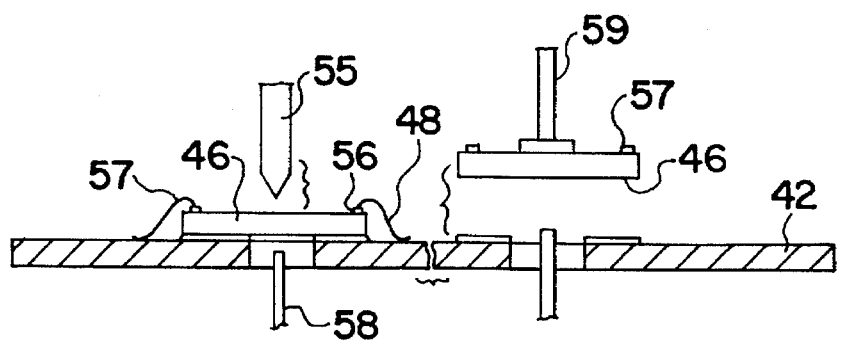

FIGS. 4A and 4B show the steps for manufacturing the known good die using the test socket of the invention.

Referring now to FIG. 4A, a test socket 40 for obtaining known good dies includes a printed circuit board 42 having penetrating apertures 41 each formed so as to have a predetermined diameter, and a casing 49 fixed by, for example, screws 53 to cover the upper portion of the printed circuit board (PCB) 42. The PCB 42 has insertion terminals (not illustrated) for electrical connection with the outside at one side thereof, and land patterns (not illustrated) are formed about the penetrating apertures 41.

After pieces of adhesive tape 43 of a predetermined shape, (e.g., rectangular shape) are attached to the PCB 42, a semiconductor chip 46 separated from the wafer is mounted on a respective adhesive tape portion 43. Bonding pads (not illustrated) of the semiconductor chip 46 and the land patterns of the PCB 42 are connected by a wire 48, and the case 49 is fixed on the PCB 42 by the screws 53. The double-sided adhesive tape 43 is weekend in adhesiveness at the surface where chip is attached, thereby facilitating separation of the chip therefrom.

Referring now to FIG. 4B, the test socket 40 comprises the PCB 42 having a plurality of wire-bonded semiconductor chips 46 mounted thereon and the casing 49. The insertion terminals of the test socket 40 are mounted on a burn-in test board (not illustrated) to carry-out the burn-in test.

After the burn-in test and after case 49 is removed, the upper parts of wire balls 56 formed on the bonding pads of the semiconductor chip 46 are cut by a cutting element movable upward or downward and left or right, such as a diamond blade, a cutting laser, or a chisel-shape cutter 55 having a sharp end portion. The bottoms of the semiconductor chips 46 are struck by an eject pin 58, used during a chip removal procedure, via the penetrating apertures 41, to separate the chips 46 from the adhesive tape 53.

The tested known good dies 46 subjected to the burn-in test are then suctioned by a vacuum chuck 59 to be sequentially transmitted to a chip carrier (not illustrated).

The known good dies 46 have bumps 57 formed on the bonding pads after wire balls 56 have been cut. The bumps 57 are directly used as flip chip and TAB connection bumps during mounting, at which time a second wire bonding may be carried out.

Therefore, by compensating or solving the problems of the conventional test socket adaptor, hot chuck technique, and TAB technique, a large quantity of known good dies having and good quality can be manufactured.

The test socket includes a substrate with penetrating apertures, each having a predetermined diameter, and land patterns formed on around the penetrating, apertures, the substrate having contact leads to be connected to the outside at one side, and a case mounted on an upper part of the substrate.

In the method for making known good dies using such a test socket, chips are first mounted by adhesive tape to cover the penetrating apertures of the substrate, then the bonding pads of the semiconductor chips are connected to the land patterns by wires. After that, the test sockets are mounted on the burn-in test board to carry out the burn-in test. The wires are then cut by means of the cutting means, and a lower portion of the semiconductor chip is struck through the penetrating aperture of the substrate. Thus, each known good die is separated and moved to a chip carrier for transmittance.

As mentioned above, since the substrate of the testing device may be formed from a PCB, it can be used for a long term, and that may reduce the production cost.

In addition, since the burn-in test is carried out by mounting the semiconductor chips on one substrate and installing a plurality of substrates on the burn-in test board, a plurality of known good dies may be supplied at a low cost, whereby MCM is applicable to the expensive supercomputer and personal computers as well.

Depending on the capacity the test socket, and depending on the method for making known good dies, more than one semiconductor chip is mounted on the test socket, and many known good dies can be obtained after the burn-in test has been performed.

While this invention has been described in connection with what is presently considered to be the most practical and preferred embodiments, it is to be understood that the invention is not limited to the disclosed embodiments, but, on the contrary, it is intended to cover various modifications and equivalent arrangements included within the spirit and scope of the appended claims.

What is claimed is:

1. A test device for testing a plurality of unpackaged semiconductor chips, comprising:
   a substrate having a plurality of semiconductor chip-mounting locations thereon, said substrate including a plurality of openings extending through said substrate, each said opening positionally corresponding to a respective semiconductor chip mounting location;
   at least one piece of double-sided adhesive tape having one side adhered on said substrate at each said semiconductor chip-mounting location; said adhesive tape being configured to leave each of said openings effectively unobstructed thereby, and having another side disposed for removably adhesively mounting a respective unpackaged semiconductor chip to said substrate at a respective semiconductor chip-mounting location, while permitting demounting of the respective unpackaged semiconductor chip by effective engagement of the chip through the respective opening from an opposite side of the substrate from the respective semiconductor chip-mounting location using an effective pushing element;
   a plurality of conductive land patterns disposed about a periphery of each opening, wherein each said semiconductor chip mounting location does not overlap a corresponding said conductive land pattern; and
   a plurality of external contact sites formed along an edge of said substrate, said external contact sites being electrically connected to said plurality of conductive land patterns, said external contact sites being constructed and arranged to be connected with circuitry which is external to the test device.

2. The test device as claimed in claim 1, wherein said substrate is formed from a ceramic.

3. The test device as claimed in claim 1, wherein said at least one piece of double-sided adhesive tape is constituted by a plurality of double-faced adhesive tape portions, each said tape portion having an opening formed therethrough which is aligned with a corresponding one of said openings of said substrate.

4. The test device as claimed in claim 3, wherein said tape portion can withstand a peak temperature associated with a chip burn-in test.

5. The test device as claimed in claim 1, further comprising a protective casing detachably engaged with said substrate, said casing protectively covering said plurality of openings and said plurality of land patterns while leaving said external contact sites exposed.

6. The test device as claimed in claim 5, wherein said casing is made from a static-electricity resistant material.

7. The test device as claimed in claim 5, wherein said protective casing is engaged with said substrate by a screw.

8. The test device as claimed in claim 1, wherein the external circuitry is a burn-in test circuit having a plurality of receiving portions for receiving a plurality of the test devices.

9. The test device as claimed in claim 8, wherein the receiving portions of the burn-in test circuit are a plurality of slot connectors, wherein said substrate includes an externally-protruding tab portion along which said external contact sites are provided, said tab portion being engageable in a respective slot connector of the burn-in test circuit.

10. The test device as claimed in claim 1, wherein said substrate is a printed circuit board.

11. A testing method for obtaining a plurality of known-good dies, comprising the steps of:
   mounting at least one semiconductor chip a plurality of unpackaged semiconductor chips on a test substrate having a plurality of semiconductor chip mounting locations provided thereon; the test substrate having a plurality of openings formed therethrough, each semiconductor chip being mounted on the test substrate so that it substantially covers a respective opening; said mounting including mounting each chip on the test substrate using double-faced adhesive tape which is sized, shaped and positioned so as to leave each said opening effectively unobstructed by said adhesive tape;
   electrically connecting each semiconductor chip to the test substrate;
   connecting the test substrate to a burn-in test board such that each semiconductor chip is electrically connected to the burn-in test board;
   performing a burn-in test on each semiconductor chip mounted on the test substrate;
   disconnecting the at least one semiconductor chip from electrical connection to the test substrate; and
   identifying and physically separating each semiconductor chip successfully passing the burn-in test from the substrate, including applying force through a respective opening in the test substrate against one side of each semiconductor chip, which has been identified as having passed the burn-in test and thereby demounting that chip from said adhesive tape.

12. The testing method as claimed in claim 11, wherein said step of electrically connecting each semiconductor chip to the test substrate comprises connecting each semiconductor chip to the test substrate using a respective wire bonded to each semiconductor chip.

13. The testing method as claimed in claim 12, wherein said disconnection step comprises a step of cutting the wire connecting each semiconductor chip and the test substrate.

14. The testing method as claimed in claim 13, wherein said cutting step is performed by one of a cutting blade, a cutting laser, and a chisel-headed cutter.

15. The testing method as claimed in claim 13, wherein said step of electrically connecting each semiconductor chip to the test substrate includes using a respective wire which is ball-bonded to the respective semiconductor chip so as to form a conductive ball portion on the respective semiconductor chip, and wherein said disconnection step comprises cutting each wire at the respective conductive ball portion so as to leave a portion of the respective conductive ball portion on the respective semiconductor chip.

16. The testing method as claimed in claim 13, wherein said disconnection step comprises cutting each wire so as to leave a portion of respective wire on the respective semiconductor chip, thereby forming a respective connection bump having a substantially flat cut surface.

* * * * *